United States Patent
Kurczveil et al.

(10) Patent No.: US 11,557,877 B2
(45) Date of Patent: Jan. 17, 2023

(54) QUANTUM-DOT PHOTONICS

(71) Applicant: Hewlett Packard Enterprise Development LP, Houston, TX (US)

(72) Inventors: Geza Kurczveil, Santa Barbara, CA (US); Di Liang, Santa Barbara, CA (US); Raymond G. Beausoleil, Seattle, WA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 715 days.

(21) Appl. No.: 16/489,495

(22) PCT Filed: Feb. 28, 2017

(86) PCT No.: PCT/US2017/019893
§ 371 (c)(1),
(2) Date: Aug. 28, 2019

(87) PCT Pub. No.: WO2018/160164
PCT Pub. Date: Sep. 7, 2018

(65) Prior Publication Data
US 2020/0028323 A1 Jan. 23, 2020

(51) Int. Cl.
*H01S 5/10* (2021.01)
*G02B 6/12* (2006.01)
(Continued)

(52) U.S. Cl.
CPC ........ *H01S 5/1014* (2013.01); *G02B 6/12007* (2013.01); *G02B 6/1228* (2013.01); *H01S 5/021* (2013.01); *H01S 5/34* (2013.01)

(58) Field of Classification Search
None
See application file for complete search history.

(56) References Cited

U.S. PATENT DOCUMENTS

| 4,949,350 A | 8/1990 | Jewell et al. |
| 7,082,248 B1 | 7/2006 | Morse |

(Continued)

FOREIGN PATENT DOCUMENTS

| CN | 1858916 A | 11/2006 |
| CN | 103715317 A | 4/2014 |

(Continued)

OTHER PUBLICATIONS

Akiyama et al., "Pattern-effect-free semiconductor optical amplifier achieved using quantum dots," IEEE Electronics Letters, vol. 38, No. 19, Sep. 12, 2002, 2 pages.

(Continued)

*Primary Examiner* — Jerry Rahll
(74) *Attorney, Agent, or Firm* — Sheppard Mullin Richter & Hampton LLP

(57) ABSTRACT

Examples disclosed herein relate to quantum-dot (QD) photonics. In accordance with some of the examples disclosed herein, a QD semiconductor optical amplifier (SOA) may include a silicon substrate and a QD layer above the silicon substrate. The QD layer may include an active gain region to amplify a lasing mode received from an optical signal generator. The QD layer may have a gain recovery time such that the active gain region amplifies the received lasing mode without pattern effects. A waveguide may be included in an upper silicon layer of the silicon substrate. The waveguide may include a mode converter to facilitate optical coupling of the received lasing mode between the QD layer and the waveguide.

20 Claims, 12 Drawing Sheets

(51) Int. Cl.
*G02B 6/122* (2006.01)
*H01S 5/02* (2006.01)
*H01S 5/34* (2006.01)

(56) References Cited

U.S. PATENT DOCUMENTS

| | | |
|---|---|---|
| 7,859,746 B2 | 12/2010 | Morito et al. |
| 8,357,926 B2 | 1/2013 | Wang et al. |
| 8,380,032 B2 | 2/2013 | Hasegawa et al. |
| 9,182,647 B2 | 11/2015 | Akiyama |
| 9,431,791 B1 | 8/2016 | Norberg et al. |
| 2003/0047752 A1 | 3/2003 | Campbell et al. |
| 2006/0049336 A1 | 3/2006 | Matsuda et al. |
| 2006/0251375 A1 | 11/2006 | Morse |
| 2010/0142973 A1 | 6/2010 | Gubenko et al. |
| 2010/0165356 A1 | 7/2010 | Takagi |
| 2010/0245990 A1 | 9/2010 | Tanaka et al. |
| 2017/0207600 A1 | 7/2017 | Klamkin et al. |

FOREIGN PATENT DOCUMENTS

| | | |
|---|---|---|
| CN | 105679875 A | 6/2016 |
| CN | 107111060 A | 8/2017 |
| WO | 2016/011002 A1 | 1/2016 |

OTHER PUBLICATIONS

Kurczveil et al., "Robust hybrid quantum dot laser for integrated silicon photonics," Optics Express, vol. 24, No. 14, Jul. 11, 2016, p. 16167-16174.

Partial European Search Report received for EP Patent Application No. 17898819.2, dated Oct. 6, 2020, 19 pages.

Umezawa et al., "Investigation of a 1.5-µm-Wavelength InAs-Quantum-Dot Absorption Layer for High-Speed Photodetector", Applied Physics Express 7, The Japan Society of Applied Physics, 2014, 4 pages.

Elkurdi, M. et al.; "Near-Infrared Waveguide Photodetector with Ge/Si Self-Assembled Quantum Dots"; Jan. 21, 2002; 3 pages.

International Search Report and Written Opinion received for PCT Patent Application No. PCT/US2017/19893, dated Nov. 30, 2017, 8 pages.

Ng et al., "Avalanche Multiplication Characteristics of Al0.8Ga0.2As Diodes", IEEE Transactions on Electron Devices, vol. 48, Issue 10, 2001, pp. 2198-2204.

Piels, M. et al.: "Photodetectors for Silicon Photonic Integrated Circuits"; Oct. 16, 2015; 18 pages.

Sandall et al., "1300 nm wavelength InAs quantum dot photodetector grown on silicon", Optics Express, vol. 20, No. 10, May 7, 2012, pp. 10446-10452.

Umezawa, T. et al.; "Waveguide Avalanche Photodetector Using Quantum-Dot Superlattice for Optical Fiber Communications"; Jul. 31, 2017; 2 pages.

Wan et al., "Monolithically integrated InAs/InGaAs quantum dot photodetectors on silicon substrates", Optics Express, vol. 25, Issue 22, Oct. 30, 2017, pp. 27715-27723.

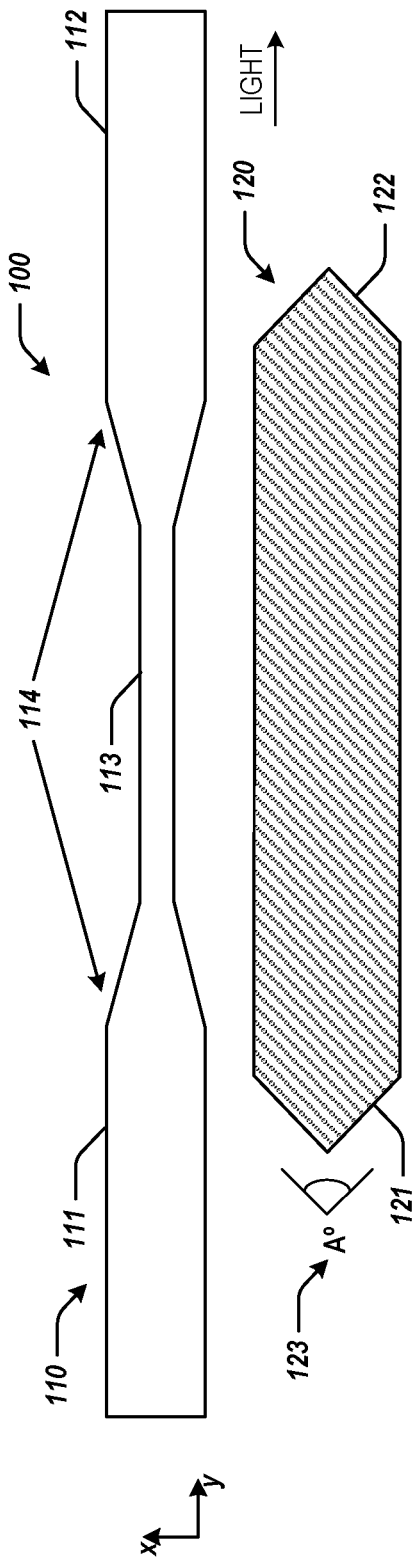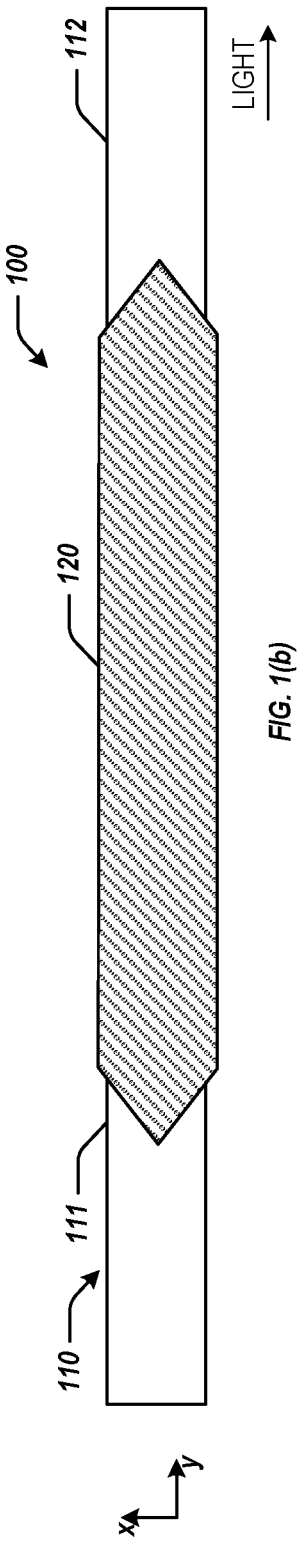
FIG. 1(a)
FIG. 1(b)

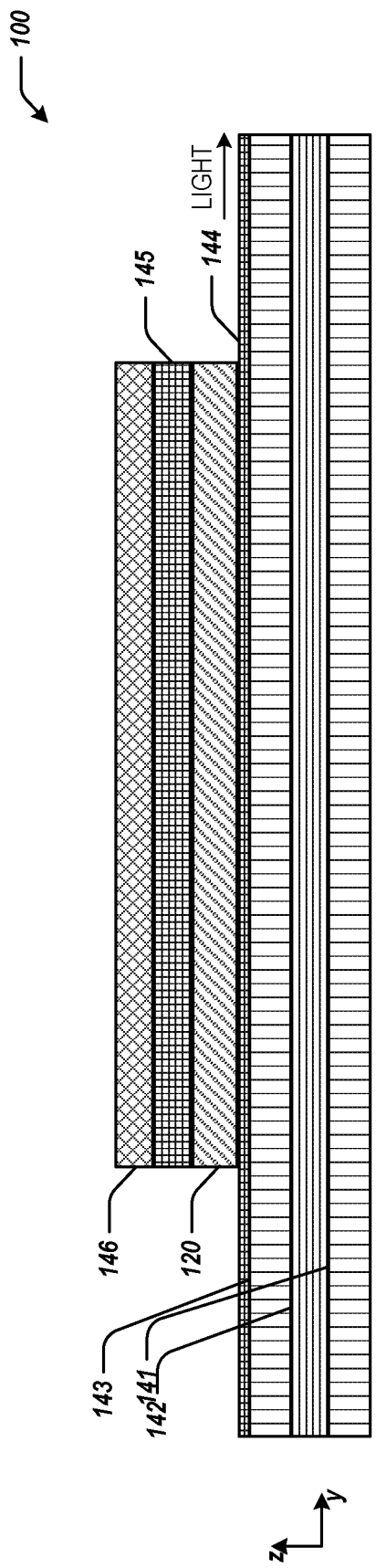
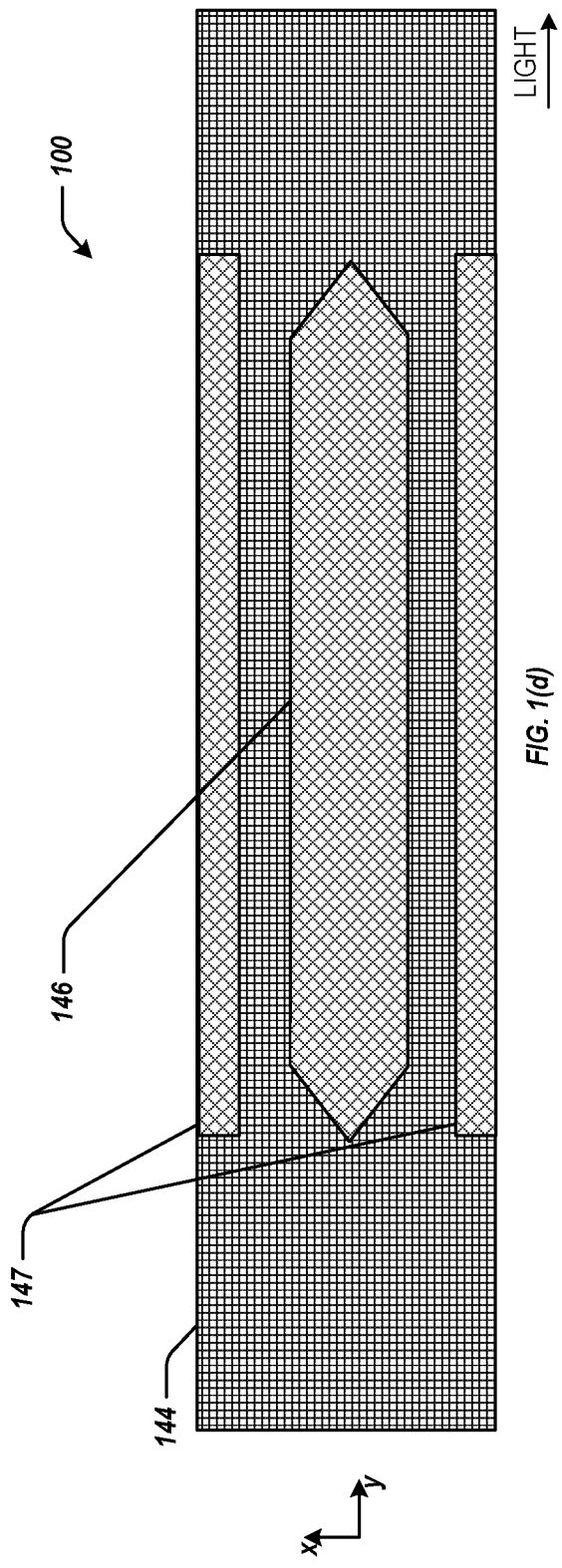
FIG. 1(c)
FIG. 1(d)

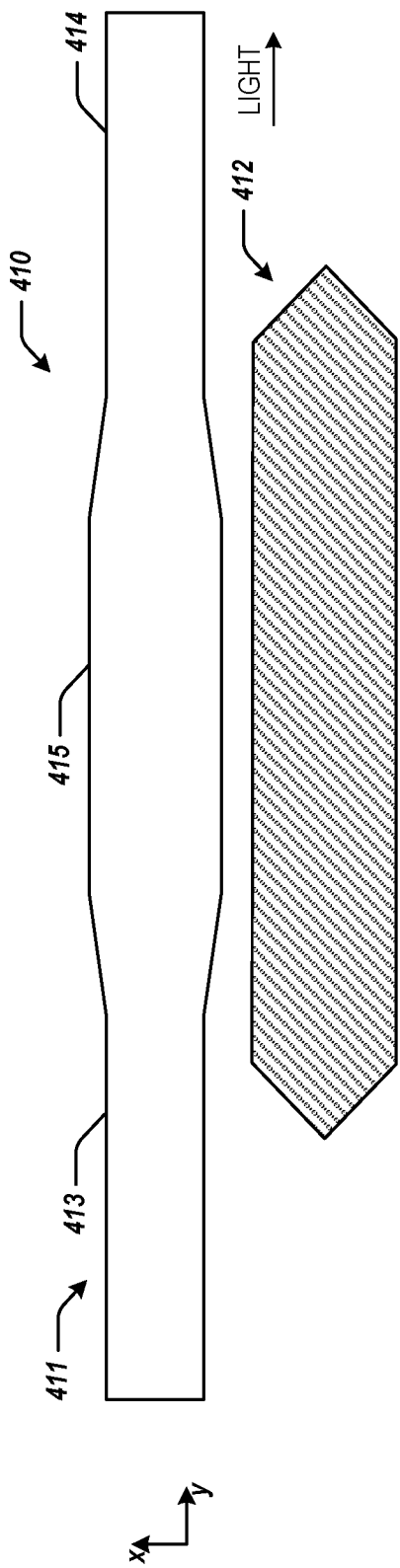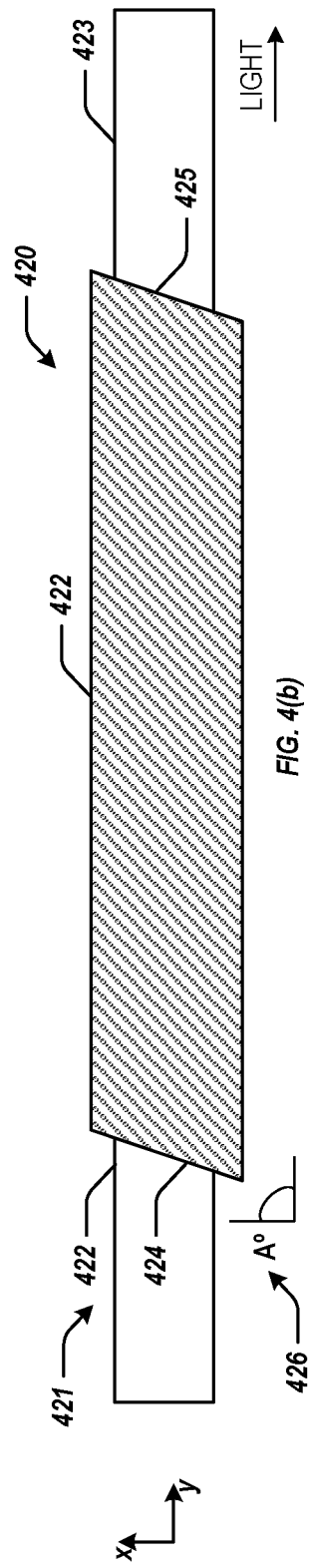

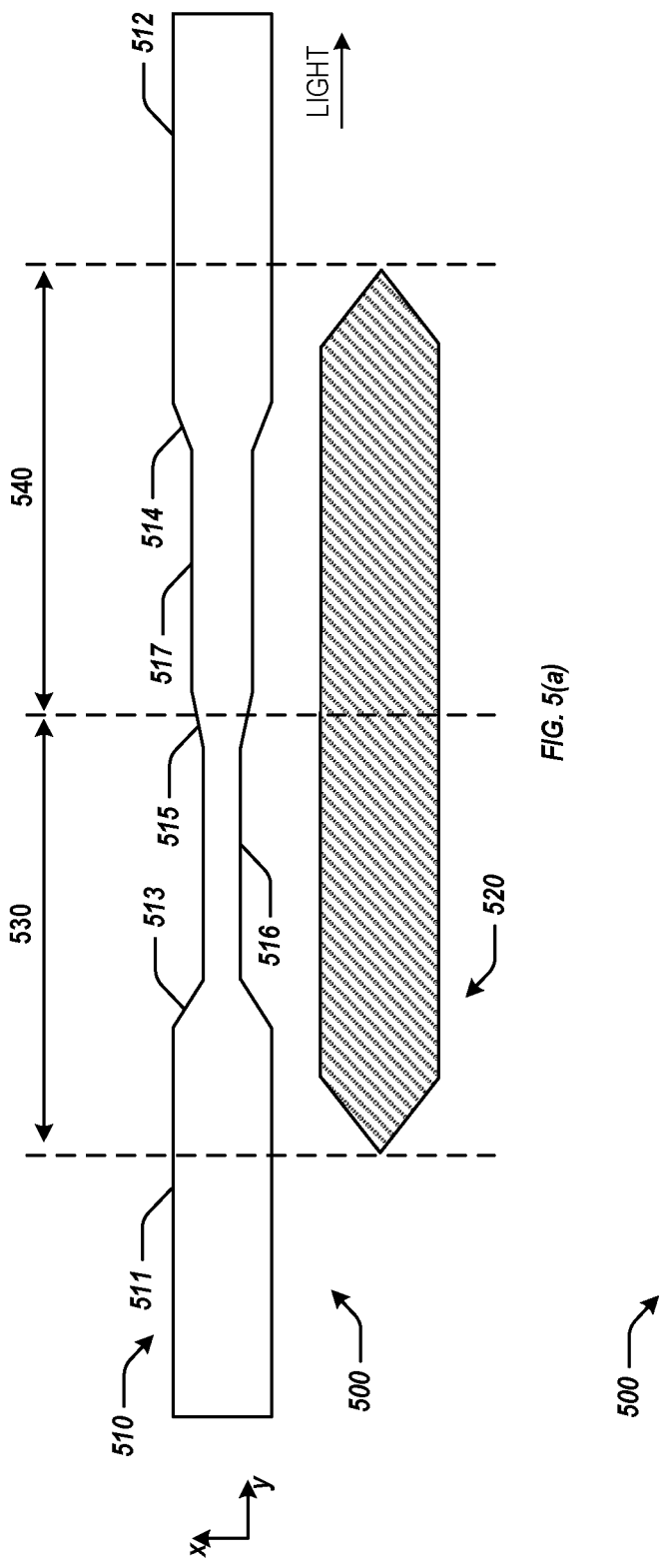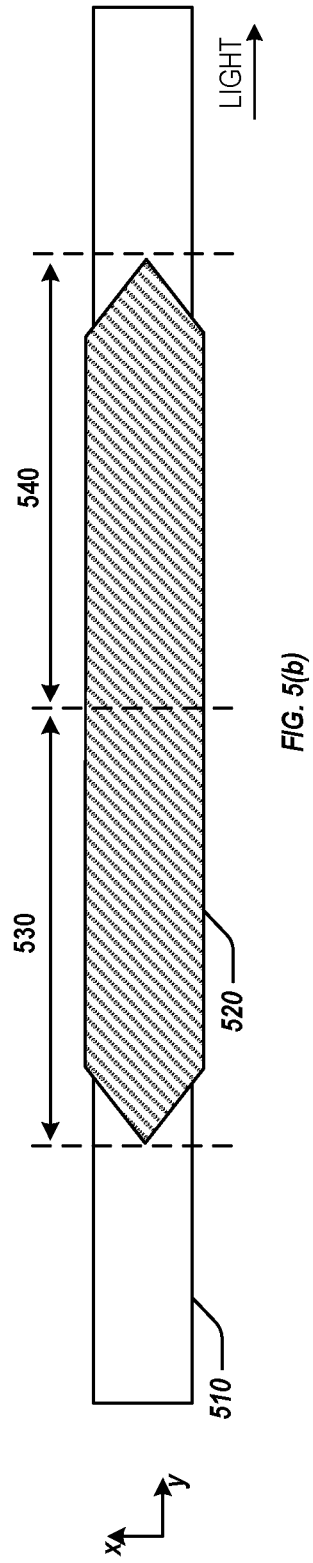

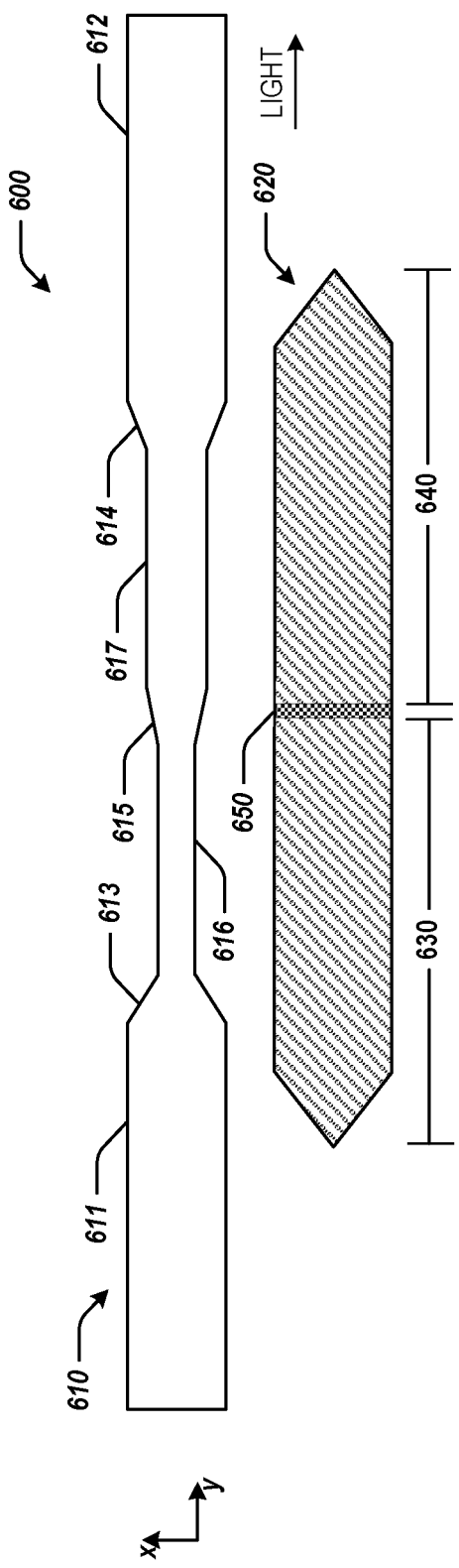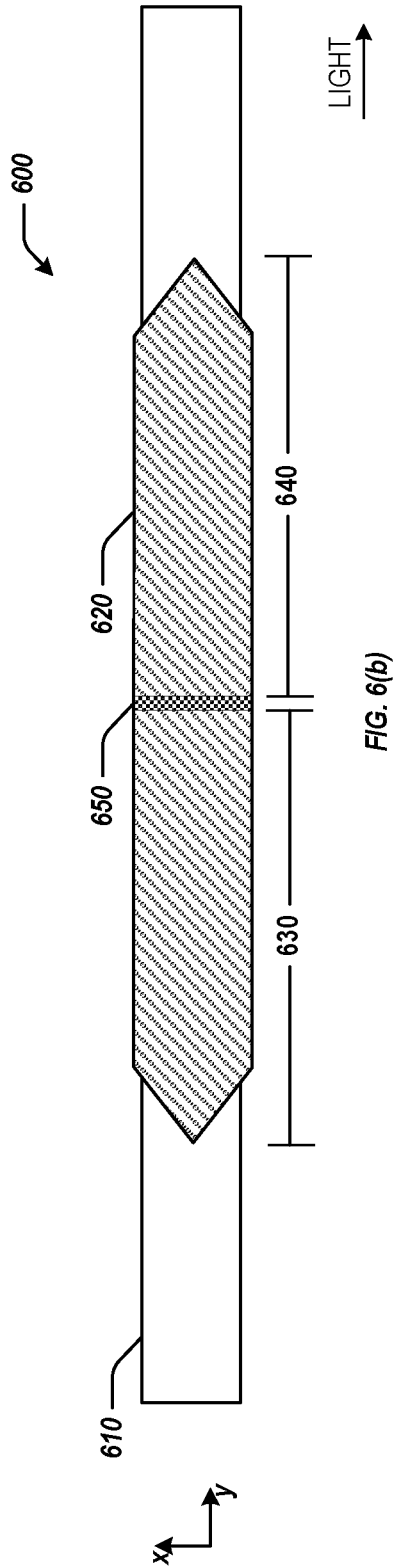
FIG. 6(a)
FIG. 6(b)

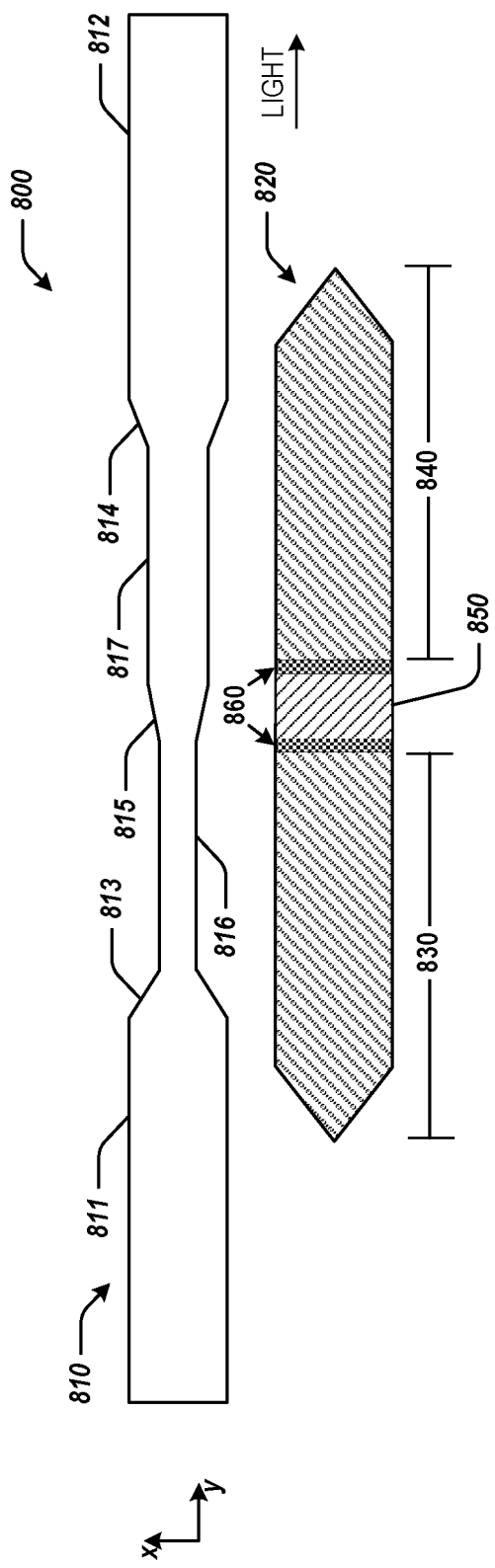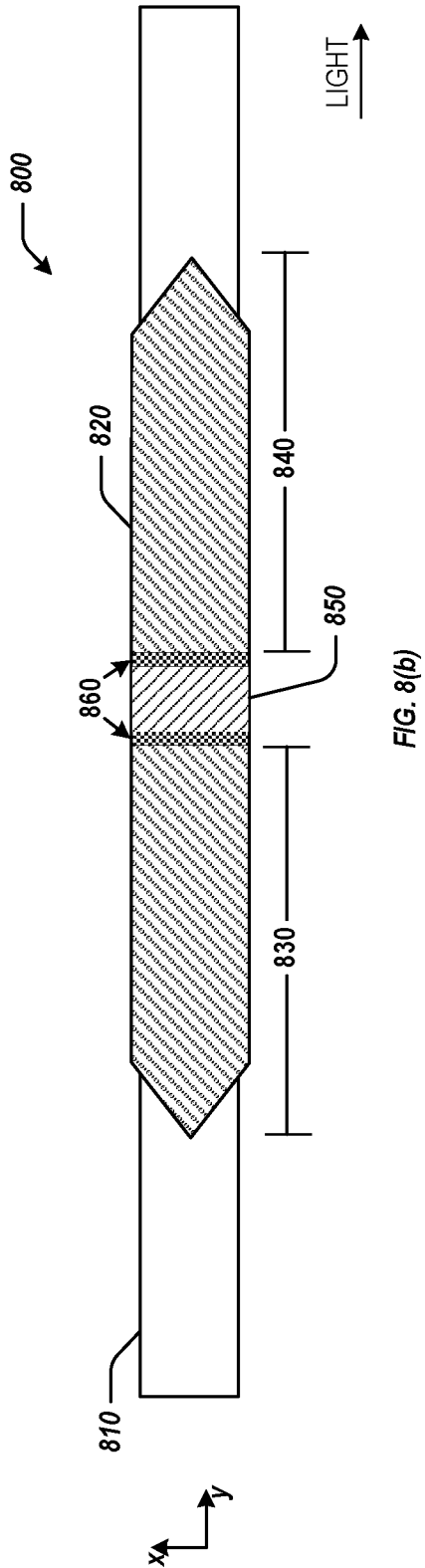

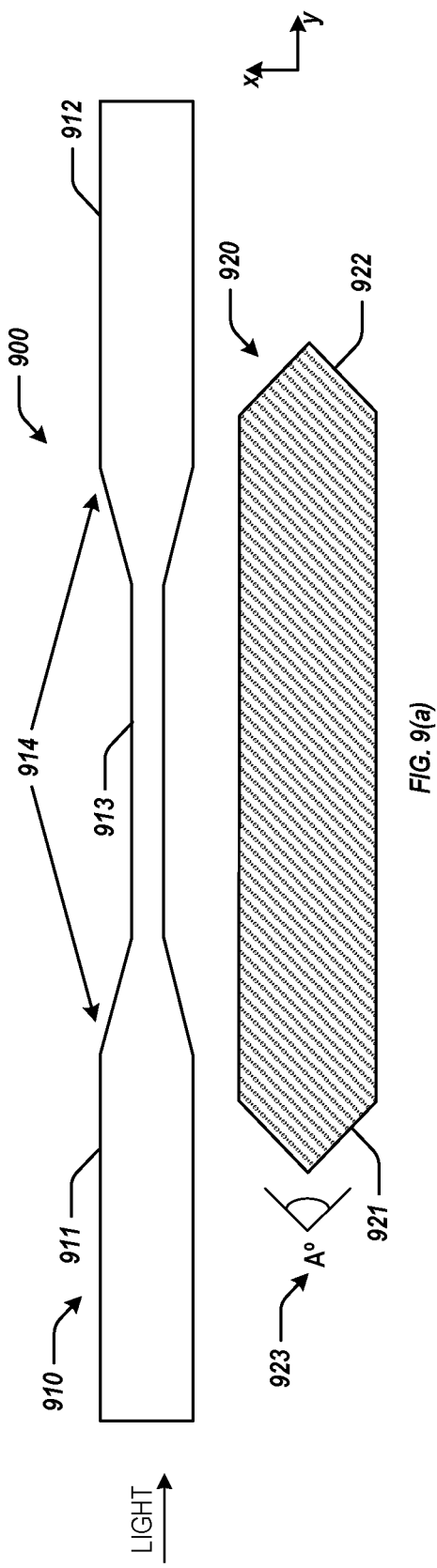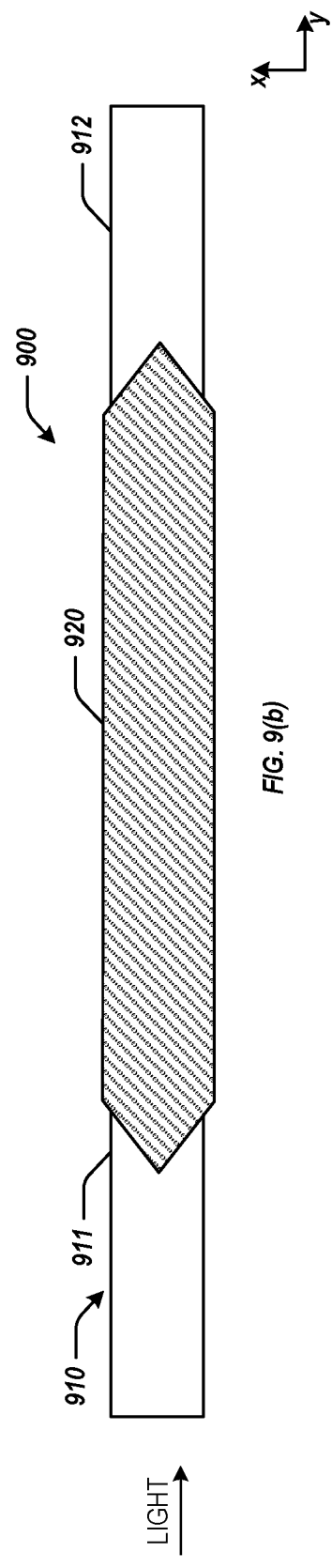
FIG. 9(a)
FIG. 9(b)

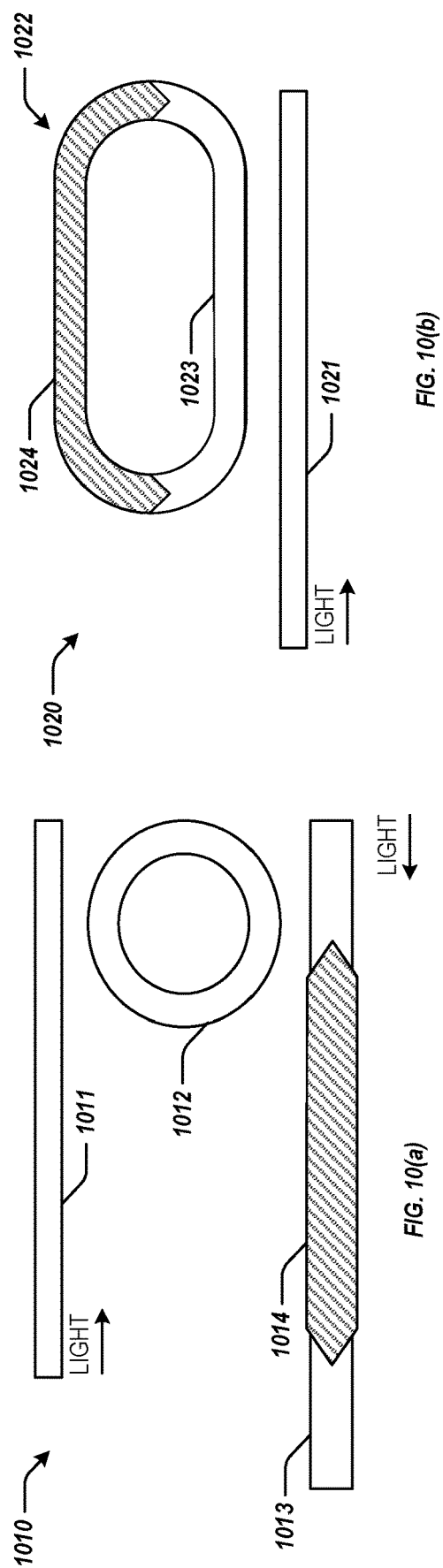
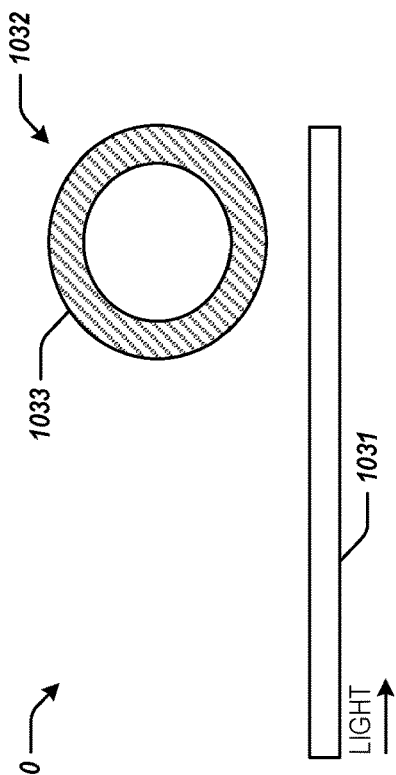
FIG. 10(a)
FIG. 10(b)
FIG. 10(c)

QUANTUM-DOT PHOTONICS

STATEMENT OF GOVERNMENT INTEREST

This invention was made with government support under Contract No. H98230-12-C-0236, awarded by Maryland Procurement Office. The government has certain rights in the invention.

BACKGROUND

Optical systems may be used to manipulate optical signals in various ways. For example, photodetectors may absorb an optical signal and convert it into an electrical current. As another example, optical amplifiers, such as semiconductor optical amplifiers (SOAs), may be used to directly amplify optical signals, such as those generated by lasers.

BRIEF DESCRIPTION OF THE DRAWINGS

The following detailed description references the drawings, wherein:

FIGS. 1(a)-1(d) are block diagrams depicting an example quantum-dot (QD) SOA;

FIGS. 4(a) and 4(b) are block diagrams depicting an example QD SOAs;

FIGS. 5(a) and 5(b) are block diagrams depicting an example QD SOA;

FIGS. 6(a) and 6(b) are block diagrams depicting an example QD SOA;

FIGS. 8(a) and 8(b) are block diagrams depicting an example QD SOA;

FIGS. 9(a)-9(c) are block diagrams depicting an example QD photodetector; and

FIGS. 10(a)-10(c) are block diagrams depicting example QD photodetectors.

DETAILED DESCRIPTION

Figure 2:
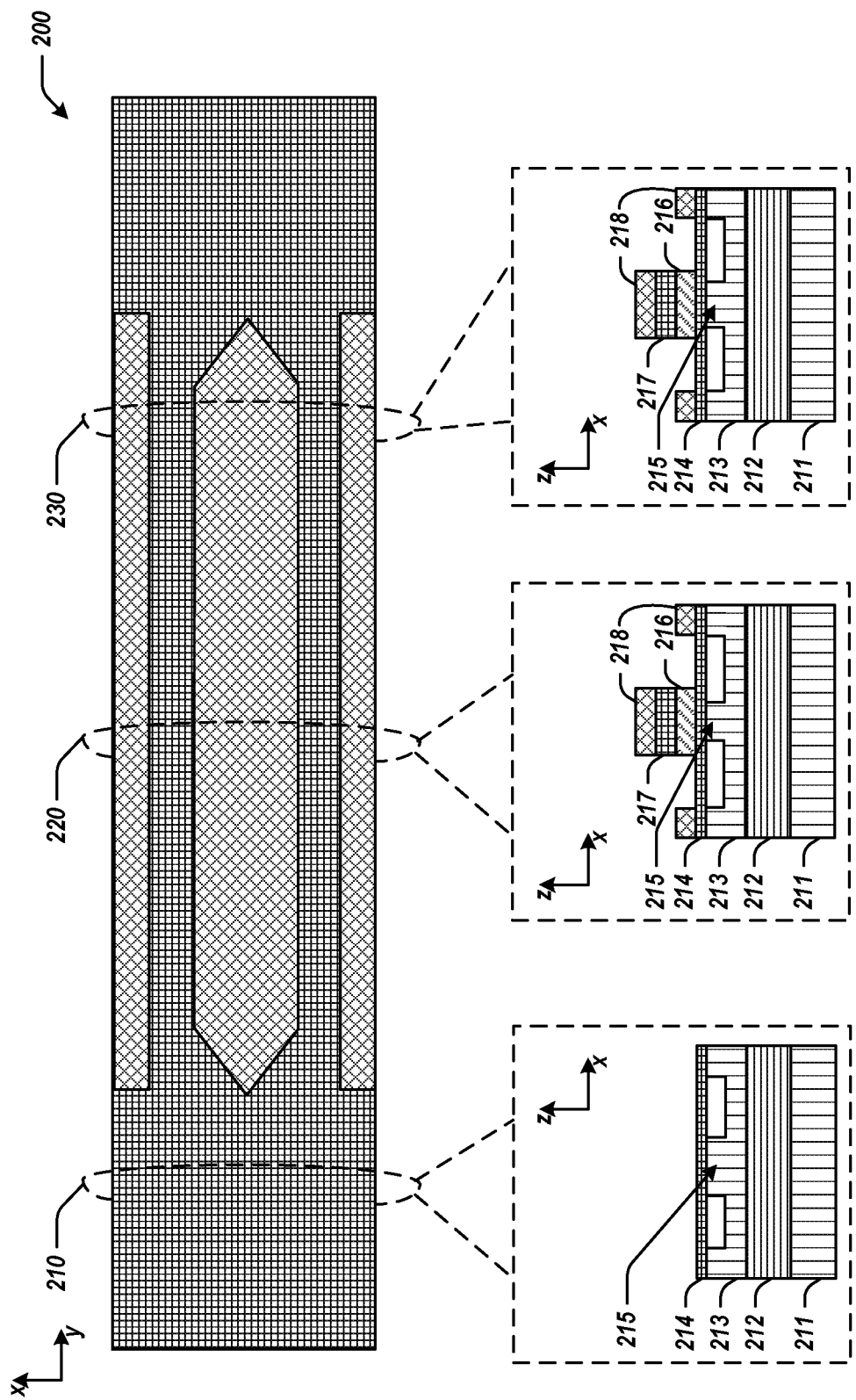
FIG. 2 is a block diagram depicting cross-sectional views of an example QD SOA.

The following detailed description refers to the accompanying drawings. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

The terminology used herein is for the purpose of describing particular examples only and is not intended to be limiting. As used herein, the singular forms "a", "an," and "the" are intended to include the plural forms as well, unless the context clearly indicates otherwise. The term "plurality," as used herein, is defined as two or more than two. The term "another," as used herein, is defined as at least a second or more. The term "coupled," as used herein, is defined as connected, whether directly without any intervening elements or indirectly with at least one intervening elements, unless otherwise indicated. Two elements can be coupled mechanically, electrically, or communicatively linked through a communication channel, pathway, network, or system. The term "and/or" as used herein refers to and encompasses any and all possible combinations of the associated listed items. It will also be understood that, although the terms first, second, third, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Examples disclosed herein provide QD optical systems. In some implementations, examples disclosed herein provide QD SOAs fabricated on silicon or silicon-on-insulator (SOI) substrates. The example QD SOAs disclosed herein provide fast gain recovery time, making them immune to pattern effects typically observed in QW SOAs. Accordingly, the disclosed QD SOAs are capable of being used in high-speed data systems while being integrated at high volumes and low cost. Moreover, the example QD SOAs disclosed herein are capable of being integrated with high-quality passive silicon components, such as grating couplers, power splitters, multiplexers/de-multiplexers, SiGe and InGaAs photodetectors, etc., on a single chip in high volume at low cost.

In accordance with some of the examples disclosed herein, a QD SOA may include a silicon substrate and a QD layer above the silicon substrate. The QD layer may include an active gain region to amplify a lasing mode received from a laser. The QD layer may have a gain recovery time such that the active gain region amplifies the received lasing mode without pattern effects. A waveguide may be included in an upper silicon layer of the silicon substrate. The waveguide may include a mode converter to facilitate optical coupling of the received lasing mode between the QD layer and the waveguide.

In some implementations, examples disclosed herein provide QD photodetectors fabricated on silicon or SOI substrates. The example QD photodetectors disclosed herein may generate less dark current compared to bulk and QW photodetectors and therefore have greater sensitivity. In accordance with some of the examples disclosed herein, a QD photodetector may include a silicon substrate, a waveguide in an upper silicon layer of the silicon substrate, and a QD layer above the waveguide. The waveguide may include a mode converter to facilitate optical coupling of an optical signal between the waveguide and a QD layer. The QD layer may include an absorption region to absorb photons from the coupled optical signal and to generate a photocurrent from the absorbed photons.

FIGS. 1(a) and 1(b) are block diagrams depicting top-down views of an example QD SOA 100. As shown in FIGS. 1(a) and 1(b), QD SOA 100 may include various components, such as a waveguide 110 included in an upper silicon layer of a silicon substrate, such as a SOI substrate, and a QD layer 120 that includes an active gain region. The number and arrangement of these components is an example only and provided for purposes of illustration. Other arrangements and numbers of components may be utilized without departing from the examples of the present disclosure, FIG. 1(a) depicts QD SOA 100 in an exploded view, showing the detail of waveguide 110 and QD layer 120, whereas FIG. 1(b) depicts QD SOA 100 in an assembled view.

Waveguide 110 may be used to guide the propagation of light (e.g., an optical signal such as a lasing mode) generated by, for example, an optical signal generator. QD SOA 100 may be used with various types of optical signal generators, such as semiconductor lasers (e.g., laser diodes, QW lasers, QD lasers, etc.), or anywhere where an optical signal boosting may be desired. QD SOA 100 may receive the optical signals directly and/or indirectly from the optical signal generator or other components.

As shown in FIG. 1(a), waveguide 110 may have various widths. As used herein, "length" may be defined along the y-axis in the drawings, "width" may be defined along the x-axis, and "height" or thickness" may be defined along the z-axis. Waveguide 110 may have a width 111 at the beginning or front of QD SOA 100 (i.e., closest toward the optical signal input), a width 112 at the end or back of QD SOA 100 (i.e., furthest away from the optical signal input), and a width 113 between width 111 and width 112. In some implementations, width 111 and width 112 may be the same or substantially similar in width. Width 111 and width 112 may be greater than width 113 while in other implementations width 111 and width 112 may be less than width 113.

The tapers between width 111, width 112, width, 113 may be implemented by a mode converter 114. Mode converter 114 may include a plurality of tapers: one taper to taper width 111 down (or up in some implementations) to width 113, and another taper to taper width 113 up (or down in some implementations) to width 112. Mode converter 114 may facilitate coupling of lasing modes between waveguide 110 and QD layer 120. The optical coupling may be achieved as a result of the tapers of mode converter 114. That is, the tapers of mode converter 114 may push the lasing mode up into QD layer 120 so that it can be amplified and may pull the amplified lasing mode back down into the silicon of waveguide 110. Mode converter 114 may be designed such that it meets certain performance characteristics. For example, mode converter 114 may be designed to be adiabatic. As another example, mode converter 114 may be designed such that it couples a single lasing mode with very low loss and low back reflection. Mode converters that are designed to be too short may suffer from high passive losses whereas mode converters that are designed to be too long may result in non-uniform electrical pumping.

QD layer 120 may be a mesa structure formed using various III-V semiconductor QD materials, such as InAs, InGaAs, GaAs, InP, InGaP, InGaAsP, etc. The mesa structure may be formed by bonding QD layer 120 to a silicon substrate via wafer bonding and then etching the sides of QD layer 120. QD layer 120 may include an active region to amplify a lasing modes. In some implementations, the entire QD layer 120 may be the active gain region, whereas in other implementations a portion of QD layer 120 may make up the active gain region.

QD layer 120 may include junctions 121 and 122 at each end of QD layer 120. In some implementations, at least one of junctions 121 and 122 may be tapered junctions such as those shown in FIGS. 1(a) and 1(b). The taper angle A° may be, for example, between 1°-90°. QD layer 120 may be above (e.g., either directly on top of or on top other intervening layers) waveguide 110, and the tapers of mode converter 114 may be under QD layer 120 when QD SOA 100 is assembled. QD layer 120 may generally be above or on top of a portion of wave guide 110, as shown in FIG. 1(b).

To amplify a lasing mode, the lasing mode may travel along waveguide 110 to the first taper of mode converter 114, where the lasing mode may be coupled up into the active gain region of QD layer 120. The lasing mode may be amplified in the active gain region through stimulated emission of photons as charge carriers are electrically pumped into the active gain region. The amplified lasing mode may travel through QD layer 120 until it reaches the second taper of mode converter 114, which couples the amplified lasing mode down into waveguide 110. The lasing mode at the output of QD SOA 100 may have more optical power than the lasing mode entering QD SOA 100 at the input as a result of the amplification.

The QD material of QD layer 120 may comprise quantum dots, or nanoscale semiconductor particles. The QD material may have a very short gain recovery time such that the active gain region of QD layer 120 may amplify the lasing mode from an optical signal generator without pattern effects. The very short gain recovery time may be attributable to the QD material's ability to quickly replenish charge carriers as they are absorbed into the lasing mode. Thus, unlike QW SOAs, which suffer from pattern effects due as a result of not being able to replenish charge carriers quickly enough, QD SOA 100 may operate at high data rates (e.g., 10-20 Gb/s) free of pattern effects due to the QD material's very short recovery time. Moreover, the improvements in performance over QW SOAs becomes even more evident when using multi-level modulation such as pulse amplitude modulation 4 (PAM4).

FIG. 1(c) is a block diagram depicting a side view of QD SOA 100. As shown in FIG. 1(c), additional layers are illustrated, such as a lower silicon layer 141, a buried oxide (BOX) layer 142, an upper silicon layer 143, a lower cladding layer 144, an upper cladding layer 145, and a metal layer 146. The number and arrangement of these components is an example only and provided for purposes of illustration. Other arrangements and numbers of components may be utilized without departing from the examples of the present disclosure. For example, QD SOA 100 may include additional metal layers that have been omitted from FIG. 1(c) for the sake of clarity.

As shown in FIG. 1(c), waveguide 110 may be formed in upper silicon layer 143. Upper silicon layer 143, lower silicon layer 141, and BOX 142 may make up the silicon substrate. Lower cladding layer 144 may be formed above the silicon substrate, QD layer 120 may be formed above lower cladding layer 144, upper cladding layer 145 may be formed above QD layer 120, and metal layer 146 may be formed above upper cladding layer 145. Lower cladding layer 144 and upper cladding layer 145 may comprise materials such as AlGaAs and/or GaAs. Metal layer 146 may comprise any electrically conducting metal and may serve as an electrode for injecting charge carriers into QD layer 120. BOX layer 142 may comprise an oxide such as $SiO_2$.

FIG. 1(d) is a block diagram depicting a top-down view of QD SOA 100. As shown in FIG. 1(d), additional layers are illustrated, such as a pair of metal layers 147 above lower cladding layer 144. The number and arrangement of these components is an example only and provided for purposes of illustration. Other arrangements and numbers of components may be utilized without departing from the examples of the present disclosure.

Metal layers 147 may be electrodes for injecting charge carriers into QD layer 120 and may comprise electrically conducting metals similar to those for metal layer 146. As shown in FIG. 1(d), metal layers 147 may be the same or substantially similar in length as QD layer 120 to ensure uniform charge carrier distribution in the active gain region.

FIG. 2 is a block diagram depicting cross-sectional views 210, 220, and 230 of an example QD SOA 200. In some implementations, QD SOA 200 may be similar to, or implemented by, QD SOA 100 depicted in FIGS. 1(a)-1(d). The number and arrangement of these components is an example only and provided for purposes of illustration. Other arrangements and numbers of components may be utilized without departing from the examples of the present disclosure.

Cross-sectional view 210 may be a cross-sectional view of QD SOA 200 at a location near a first end of QD SOA 200's waveguide 215 (e.g. waveguide 110 of FIGS. 1(a)-1(c)) where no part of the QD layer 216 (e.g., QD layer 120 of FIGS. 1(a)-1(c)) is above waveguide 215. In cross-sectional view 210, layers 211, 212, and 213 may make up a silicon substrate, wherein layer 211 is a lower silicon layer (e.g., lower silicon layer 141 of FIG. 1(c)), layer 212 is a BOX layer (e.g., BOX layer 142 of FIG. 1(c)), and layer 213 is an upper silicon layer (e.g., upper silicon layer 143 of FIG. 1(c)), Waveguide 215 of QD SOA 200 may be formed in upper silicon layer 213 of the silicon substrate. Waveguide 215 may have a first width (e.g., width 111 of FIGS. 1(a) and 1(b)) at the point along waveguide 215 where cross-sectional view 210 is located. A lower cladding layer 214 (e.g., lower cladding layer 144 of FIGS. 1(c) and 1(d)) may be deposited on top of upper silicon layer 213.

Cross-sectional view 220 may be a cross-sectional view of QD SOA 200 at a location near the center of QD SOA 200's waveguide 215 and QD layer 216. At the location of cross-sectional view 220, waveguide 215 of QD SOA 200 may be at a second width (e.g., width 113 of FIG. 1(a)) smaller than the first width while the width of QD layer 216 may be at its widest. Moreover, at the location of cross-sectional view 220, in addition to the layers illustrated at cross-sectional view 210, QD SOA 200 may include an upper cladding layer 217 (e.g., upper cladding layer 145 of FIG. 1(c)) and metal layers 218 (e.g., metal layers 146 and 147 of FIGS. 1(c) and 1(d)).

Cross-sectional view 230 may be a cross-sectional view of QD SOA 200 at the location of the second taper of QD SOA 200's mode converter (e.g., mode converter 114 of FIG. 1(a)). That is, at the location where QD SOA 200's waveguide 215 tapers between the second width and a third width (e.g., width 112 of FIG. 1(a)) the same or substantially similar to the first width. The layers at the location of cross-sectional view 230 may be similar to those at the location of cross-sectional view 220, except that QD SOA 200's waveguide 215 may be at a width in between the second width and the third width.

The width of waveguide 215 included in QD SOA 200 in the x-axis of FIG. 2 may range from about 300 nm to about 2 μm and the thickness of waveguide 215 in the z-axis may range from about 200 nm to about 500 nm. The width of QD layer 216, except in the tapered junction regions, may range from about 1 μm to about 10 μm and the thickness of QD layer 216 may range from about 100 nm to about 500 nm. The width of QD layer 216 between its tapered junctions may generally be greater than the width of waveguide 215 at any of its varying widths.

Figure 3A:
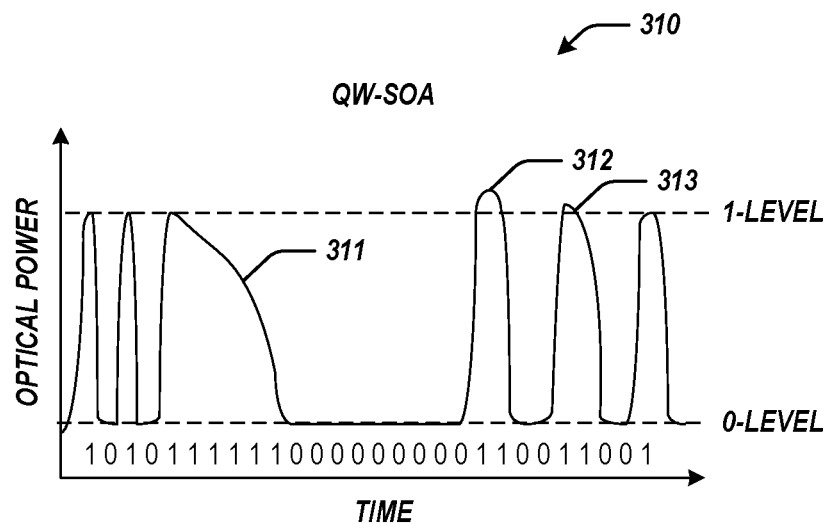
FIGS. 3(a) and 3(b) are illustrations of example optical signals respectively produced by a quantum-well (QW) SOA and an example QD SOA.
Figure 3B:
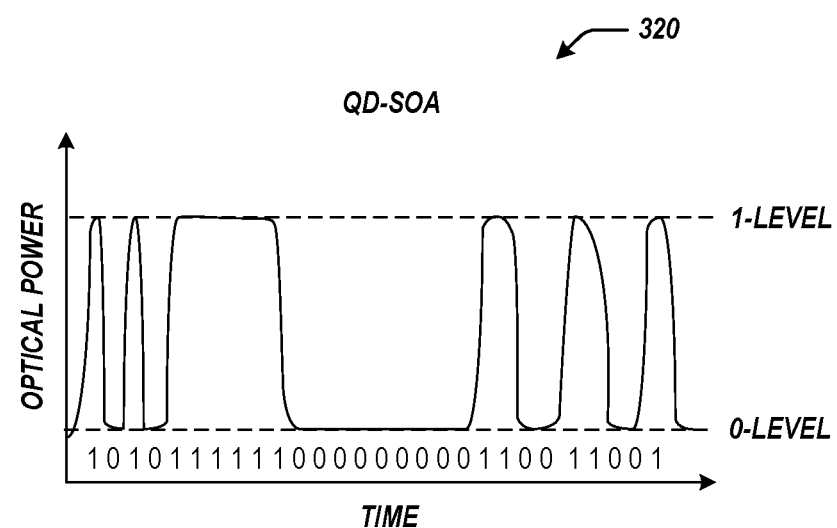

FIGS. 3(a) and 3(b) are graphical representations of amplified optical signal outputs. FIG. 3(a) illustrates an amplified optical signal output 310 from a QW SOA, whereas FIG. 3(b) illustrates an amplified optical signal output 320 from a QD SOA, such as QD SOA 100 of FIGS. 1(a)-1(d) or QD SOA 200 of FIG. 2.

As shown in FIG. 3(a), pattern effects 311, 312, and 313 occur in optical signal output 310 due to the inability of QW SOAs to quickly replenish charge carriers in the active gain region at high data rates. Pattern effect 311, for example, may result from the lasing mode absorbing charge carriers in the active gain region of the QW SOA faster than charge carriers can be replenished in the active gain region. As a result, change carriers become less and less available for amplifying the lasing mode in the active gain region, resulting in the loss of optical power at the 1-level over time at pattern effect 311. As another example, pattern effects 312 and 313 may occur due to the QW SOA attempting to replenish charge carriers in the active gain region when optical signal output 310 transitions to the 0-level after pattern effect 311. Due to the QW SOA attempting to compensate for the inability to keep up with the absorption of charge carriers, the active gain region may become oversaturated with charge carriers, which may cause optical signal output 310 to overshoot the 1-level at pattern effects 312 and 313.

As shown in FIG. 3(b), the disclosed QD SOAs are capable of quickly replenishing charge carriers in the active gain region and therefore optical signal output 320 does not suffer from pattern effects, such as pattern effect 311, 312, and 313.

FIGS. 4(a) and 4(b) are block diagrams depicting top-down views of an example QD SOA 410 and 420, respectively. QD SOA 410 and 420 may illustrate example variations on QD SOA 100 illustrated in FIGS. 1(a)-1(d) and QD SOA 200 illustrated in FIG. 2. The number and arrangement of these components is an example only and provided for purposes of illustration. Other arrangements and numbers of components may be utilized without departing from the examples of the present disclosure.

As show in FIG. 4(a), QD SOA 410 may include a waveguide 411 and a QD layer 412. QD SOA 410 may be similar to QD SOA 100 of FIGS. 1(a)-1(d) and QD SOA 200 of FIG. 2, except that the width of waveguide 411 at width 415 between widths 413 and 414 may be wider than widths 413 and 414. The width of QD layer 412 between its tapered junctions may be greater than the width of waveguide at width 415 (and thus at widths 413 and 414 as well).

As show in FIG. 4(b), QD SOA 420 may include a waveguide 421 and a QD layer 422. QD SOA 410 may be similar to QD SOA 100 of FIGS. 1(a)-1(d) and QD SOA 200 of FIG. 2, except that QD layer 422 of QD SOA 420 may have angled junctions 424 and 425 instead of tapered junctions. Angled junctions 424 and 425 may have an angle 426 of A°. A° may be, for example, between 45°-90°. QD layer 422 may be above (e.g., either directly on top of or on top other intervening layers) a portion of waveguide 421 when QD SOA 420 is assembled.

FIGS. 5(a) and 5(b) are block diagrams depicting top-down views (exploded view and assembled view, respectively) of an example QD SOA 500. In some implementations, QD SOA 500 may be similar to QD SOA 100 of FIGS. 1(a)-1(d), QD SOA 200 of FIG. 2, and/or QD SOA 400 of FIGS. 4(a)-4(b). However, and as shown in FIG. 5(a), QD SOA 500 may include a waveguide 510 having a mode converter with three tapers (i.e., taper 513, taper 514, and taper 515). The number and arrangement of these components is an example only and provided for purposes of illustration. Other arrangements and numbers of components may be utilized without departing from the examples of the present disclosure. For example, QD SOA 500 may include additional layers, such as cladding layers and metal layers that serve as electrodes for injecting charge carriers into QD layer 520.

As described above, the disclosed QD SOAs are capable of amplifying lasing modes generated by various types of optical signal generators. However, along with the amplification of the lasing mode signals comes the amplification of any noise included in the signal, Thus, to reduce amplitude noise QD layer 520 of QD SOA 500 may be partitioned into two QD SOA regions, region 530 and region 540, such that QD SOA region 530 may amplify lasing modes while QD SOA region 540 may reduce 1-level noise from the amplified lasing modes.

Taper 513 may transition waveguide 510 from width 511 to width 516, taper 515 may transition waveguide 510 from width 516 to 517, and taper 514 may transition waveguide 510 from width 517 to width 512. As shown in FIG. 5(*a*), the width 516 of waveguide 510 under QD SOA region 530 may be smaller than the width 517 of waveguide 510 under QD SOA region 540.

The width of waveguide 510 at width 511 allows most of the lasing mode (e.g., ≥90%) to be confined in waveguide 510. The smaller width of waveguide 510 under QD SOA region 530 causes a high amount of the lasing mode (e.g., around 40%) to be coupled up into QD layer 520. Here, the lasing mode can absorb more charge carriers in QD SOA region 530 resulting in high gain. As a result, the lasing mode experiences high amplification of the lasing mode in QD SOA region 530. The amplified lasing mode may then travel through QD SOA region 540, where the width of waveguide 510 at width 517 is greater than the width at width 516 but less than widths 511 and 512. Here, the confinement of the lasing mode in QD layer 520 is reduced (to roughly 10-20%, for example) such that there is low (but non-zero) gain. Then, most of the lasing mode may again be confined to waveguide 510 as it transitions to width 512.

QD SOA region 530 and 540 may be driven with high saturation power such that the output power of the SOA may be increased. Alternatively, QD SOA region 530 and 540 may be driven with low saturation power such that the output power of the SOA may be lower but with less 1-level amplitude noise.

FIGS. 6(*a*) and 6(*b*) are block diagrams depicting top-down views (exploded view and assembled view, respectively) of an example QD SOA 600. In some implementations, QD SOA 600 may be similar to QD SOA 500 of FIGS. 5(*a*) and 5(*b*). For example, QD SOA 600 may include a waveguide 610, a QD layer 620 partitioned into a QD SOA region 630 and QD SOA region 640, and a plurality of tapers 613, 614, and 615 transitioning waveguide 610 between widths 611, 612, 616, and 617. QD SOA 600 may also include an isolation region 650. The number and arrangement of these components is an example only and provided for purposes of illustration. Other arrangements and numbers of components may be utilized without departing from the examples of the present disclosure. For example, QD SOA 600 may include additional layers, such as cladding layers and metal layers that serve as electrodes for injecting charge carriers into QD layer 620.

As shown in FIG. 6(*a*), QD SOA region 630 may be above or on top of a portion of waveguide 610 at width 616 while QD SOA region 640 may be above or on top of a portion of waveguide 610 at width 617. As explained above in reference to FIGS. 5(*a*) and 5(*b*), the different widths of waveguide included in QD SOA 500 allows for the QD layer to be partitioned into a plurality of QD SOA regions. However, due to the different objectives of the two QD SOA regions, it is possible to increase the efficienly of the QD SOA by having separate metal layers for each of the QD SOA regions such that they may be individually tuned to their desired or optimum gain and saturation points.

Accordingly, QD SOA 600 may include isolation region 650 to separate the metal layer (not shown for clarity) above QD layer 620 into an electrode for QD SOA region 630 and an electrode for QD SOA region 640 so that these regions may be individually tuned to their desired or optimum gain and saturation points. Isolation region 650 may comprise a proton-implanted or etched upper cladding region (not shown) of QD SOA 600 above or on top of waveguide 610 at taper 615, and may be smaller in length (roughly 10 μm in length, as an example) than QD SOA regions 630 and 640. Moreover, QD SOA region 630 and 640 may be of different lengths from each other depending on the desired gain and saturation characteristics for these regions. For example, the length of QD SOA region 630 may be greater than the length of QD SOA region 640 or vice-versa.

With electrically isolated electrodes, QD SOA region 630 may be tuned such that has high gain and low saturation power to amplify incoming lasing modes. In some implementations, QD SOA region 640 may be tuned such that it has low gain and high saturation power to effectively "clamp" the amplified lasing modes at a higher power level. Alternatively, QD SOA region 640 may be tuned such that it has low gain and low saturation power to reduce 1-level amplitude noise of the amplified lasing modes.

Figure 7:
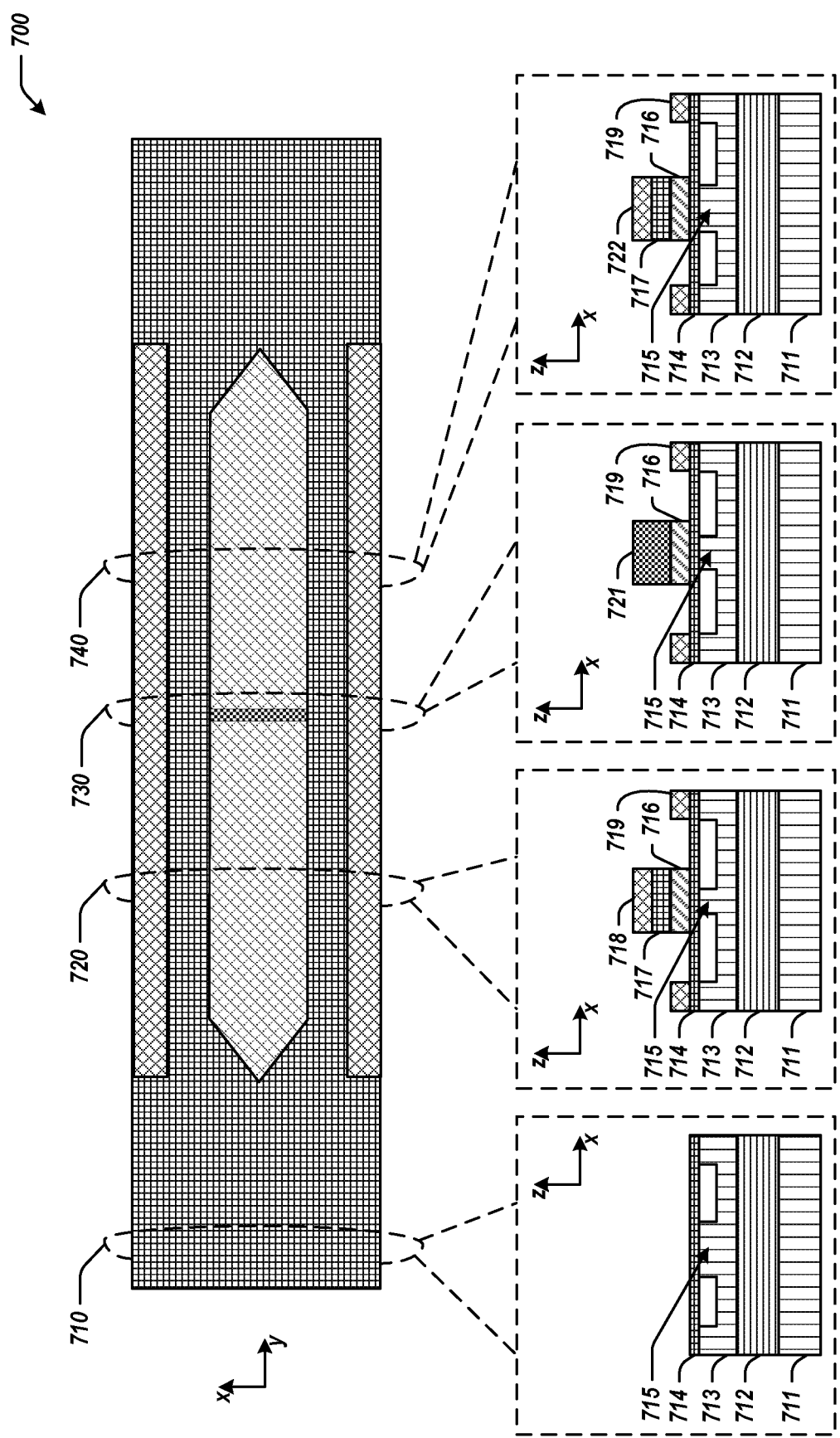
FIG. 7 is a block diagram depicting cross-sectional views of an example QD SOA.

FIG. 7 is a block diagram depicting cross-sectional views 710, 720, 730, and 740 of an example QD SOA 700. In some implementations, QD SOA 700 may be similar to, or implemented by, QD SOA 600 depicted in FIGS. 6(*a*) and 6(*d*). The number and arrangement of these components is an example only and provided for purposes of illustration. Other arrangements and numbers of components may be utilized without departing from the examples of the present disclosure.

Cross-sectional view 710 may be a cross-sectional view of QD SOA 700 at a location near a first end (i.e., the front/beginning end near the optical signal generator (not shown)) of QD SOA 700's waveguide 715 (e.g., waveguide 610 of FIGS. 6(*a*) and 6(*b*)) where no part of QD layer 716 (e.g., QD layer 620 of FIGS. 6(*a*) and 6(*b*)) is above waveguide 715. In cross-sectional view 710, layers 711, 712, and 713 may make up a silicon substrate, wherein layer 711 is a lower silicon layer, layer 712 is a BOX layer, and layer 713 is an upper silicon layer. Waveguide 715 of QD SOA 700 may be formed in upper silicon layer 713 of the silicon substrate. Waveguide 715 may have a first width (e.g., width 611 of FIG. 6(*a*)) at the point along waveguide 715 where cross-sectional view 710 is located. A lower cladding layer 714 may be deposited above or on top of upper silicon layer 713.

Cross-sectional view 720 may be a cross-sectional view of QD SOA 700 at a portion of a first QD SOA region (e.g., QD SOA region 630 of FIGS. 6(*a*) and 6(*b*)) of QD SOA 700. At the location of cross-sectional view 720, waveguide 715 of QD SOA 700 may be at a second width (e.g., width 616 of FIG. 6(*a*)) smaller than the first width while the width of QD layer 716 may be at its widest. A first mode converter taper (e.g., taper 613 of FIG. 6(*a*) may transition waveguide 715 between the first width and the second width. At the location of cross-sectional view 720, QD SOA 700 may include lower silicon layer 711, BOX layer 712, upper silicon layer 713, lower cladding layer 714, QD layer 716, an upper cladding layer 717, a first metal layer 718, and a pair of metal layers 719. First metal layer 718 and metal layers 719 may be electrodes used to inject charge carriers into the first QD SOA region of QD layer 716.

Cross-sectional view 740 may be a cross-sectional view of QD SOA 700 at a portion of a second QD SOA region (e.g., QD SOA region 640 of FIGS. 6(*a*) and 6(*b*)) of QD SOA 700. Cross-sectional view 740 may be similar to cross-sectional view 720 except that the width of waveguide 715 at the location of cross-sectional view 740 may be at a third width (e.g., width 617 of FIG. 6(a)) of waveguide 715. The third width may be greater than the second width but less than the first width. A second mode converter taper (e.g., taper 615 of FIG. 6(a)) may transition waveguide 715 between the first width and the second width. At the location of cross-sectional view 740, QD SOA 700 may include lower silicon layer 711, BOX layer 712, upper silicon layer 713, lower cladding layer 714, QD layer 716, an upper cladding layer 717, a second metal layer 722, and metal layers 719. Second metal layer 722 and metal layers 719 may be electrodes used to inject charge carriers into the second QD SOA region of QD layer 716.

Metal layers 718 and 719 may be electrically isolated from each other by an isolation region 721. Cross-sectional view 730 may be a cross-sectional view of QD SOA 700 at the location of isolation region 721, which may be positioned above or on top of the second mode converter taper in waveguide 715. That is, at the location where QD SOA 700's waveguide 715 tapers between the second width and a third width. At the location of cross-sectional view 730, QD SOA 700 may include lower silicon layer 711, BOX layer 712, upper silicon layer 713, lower cladding layer 714, QD layer 716, upper cladding layer 717, isolation region 721, and metal layers 719.

The electrical isolation of metal layers 718 and 722 by isolation region 721 allows for the first and second QD SOA regions to be individually tunable to their desired or optimum operating parameters, such as desired or optimum gain and saturation points. Accordingly, the first QD SOA region may be biased to provide high gain and low saturation power of lasing modes while the second SQ SOA region may be independently biased to either provide low gain and high saturation power of lasing modes amplified by the first QD SOA (thus clamping the amplified lasing modes at a higher output power) or low gain and low saturation power (thus removing 1-level amplitude noise from the amplified lasing modes).

FIGS. 8(a) and 8(b) are block diagrams depicting top-down views (exploded view and assembled view, respectively) of an example QD SOA 800. In some implementations, QD SOA 800 may be similar to QD SOA 500 of FIGS. 5(a) and 5(b), QD SOA 600 of FIGS. 6(a) and 6(b), and/or QD SOA 700 of FIG. 7. For example, QD SOA 800 may include a waveguide 810, a QD layer 820 partitioned into a QD SOA region 830 and QD SOA region 840, and a plurality of tapers 813, 814, and 815 transitioning waveguide 810 between widths 811, 812, 816, and 817. QD SOA 800 may also include a saturable absorption (SA) region 850 electrically isolated from QD SOA region 830 and QD SOA region 840 by an isolation region 860 on each side of SA region 850. The number and arrangement of these components is an example only and provided for purposes of illustration. Other arrangements and numbers of components may be utilized without departing from the examples of the present disclosure. For example, QD SOA 800 may include additional layers, such as cladding layers and metal layers that serve as electrodes for injecting charge carriers into QD layer 820.

As shown in FIG. 8(a), QD SOA region 830 may be above or on top of a portion of waveguide 810 at width 816 while QD SOA region 840 may be above or on top of a portion of waveguide 810 at width 817. As explained above in reference to FIGS. 5(a), 5(b), 6(a), and 6(b), the different widths of waveguide 810 included in allows for QD layer 820 to be partitioned into QD SOA region 830 for amplifying lasing modes and QD SOA region 840 for reducing 1-level amplitude noise from the amplified lasing modes.

SA region 850 may allow for further reduction in noise amplitude at the 0-level of the amplified lasing modes. SA region 850 may comprise a reverse-biased or unbiased region of gain material in QD layer 820. As shown in FIG. 8(a), SA region 850 may be positioned in between QD SOA region 830 and QD SOA region 840, and may be positioned above or on top of taper 815. The greater the length of SA region 850, the greater the amplitude noise reduction will be. However, optical loss increases as the length of SA region 850 increases. An example length of SA region 850 may be roughly 10% of the length of QD layer 820.

QD SOA 800 may include isolation regions 860 to separate the metal layer (not shown for clarity) above QD layer 620 into an electrode for QD SOA region 830, an electrode for QD SOA region 840, and an electrode for SA region 850 so that these regions may be individually tuned to their desired or optimum gain and saturation points. Isolation regions 860 may be implemented similarly to isolation region 650 of FIGS. 6(a) and 6(b) and/or isolation region 721 of FIG. 7. With electrically isolated electrodes, QD SOA region 830 may be tuned such that it is forward biased and has high gain and low saturation power to amplify lasing modes, QD SA region 850 may be tuned such that it is reverse biased or unbiased to remove 0-level amplitude noise from the amplified lasing modes, and QD SOA region 840 may be tuned such that it is forward biased and has either low gain and low saturation power (thus clamping the amplified lasing modes at a higher output power) or low gain and low saturation power (thus removing 1-level amplitude noise from the amplified lasing modes).

FIGS. 9(a) and 9(b) are block diagrams depicting top-down views of an example QD photodetector 900. As shown in FIGS. 9(a) and 9(b), QD photodetector 900 may include various components, such as a waveguide 910 included in an upper silicon layer of a silicon substrate, such as a SOI substrate, and a QD layer 920 that includes an absorption region. The number and arrangement of these components is an example only and provided for purposes of illustration. Other arrangements and numbers of components may be utilized without departing from the examples of the present disclosure. FIG. 9(a) depicts QD photodetector 900 in an exploded view, showing the detail of waveguide 910 and QD layer 920, whereas FIG. 9(b) depicts QD photodetector 900 in an assembled view.

Waveguide 910 may be used to receive and guide the propagation of optical signals such as a lasing mode generated by, for example, an optical signal generator. QD photodetector 900 may be used to receive optical signals from various types of optical signal generators, such as semiconductor lasers (e.g., laser diodes, QW lasers, QD lasers, etc.), or anywhere where an optical signal is to be received and converted into a current. QD photodetector 900 may receive the optical signals directly from the optical signal generator or indirectly through other components, such as a QD SOA.

As shown in FIG. 9(a), waveguide 910 may have various widths. Waveguide 910 may have a width 911 at the beginning or front of QD photodetector 900 (i.e., closest toward the optical signal input), a width 912 at the end or back of QD photodetector 900 (i.e., furthest away from the optical signal input), and a width 913 between width 911 and width 912. In some implementations, width 911 and width 912 may be the same or substantially similar in width. Width 911 and width 912 may be greater than width 913 while in other implementations width 911 and width 912 may be less than width 913.

The tapers between width 911, width 912, and width 913 may be implemented by a mode converter 914. Mode converter 914 may include a plurality of tapers: one taper to taper width 911 down (or up in some implementations) to width 913, and another taper to taper width 913 up (or down in some implementations) to width 912. Mode converter 914 may facilitate coupling of optical signals between waveguide 910 and QD layer 920. The optical coupling may be achieved as a result of the tapers of mode converter 914. That is, the tapers of mode converter 914 may push the optical signal up into QD layer 920 so that it can be amplified and may pull the amplified optical signal back down into the silicon of waveguide 910.

QD layer 920 may be a mesa structure formed using various III-V semiconductor QD materials, such as InAs, InGaAs, GaAs, InP, InGaP, InGaAsP, etc. The mesa structure may be formed by bonding QD layer 920 to a silicon substrate via wafer bonding and then etching the sides of QD layer 920. QD layer 920 may include an absorption region to absorb photons from the received optical signal. In some implementations, the entire QD layer 920 may be the absorption region, whereas in other implementations a portion of QD layer 920 may make up the absorption region.

QD layer 920 may include junctions 921 and 922 at each end of QD layer 920. In some implementations, at least one of junctions 921 and 922 may be tapered. The taper angle A° may be, for example, between 1°-90°. QD layer 920 may be above (e.g., either directly on top of or on top other intervening layers) waveguide 910, and the tapers of mode converter 914 may be under QD layer 920 when QD photodetector 900 is assembled. QD layer 920 may generally be above or on top of a portion of wave guide 910, as shown in FIG. 9(b).

To generate a photocurrent from a received optical signal, the optical signal may travel along waveguide 910 to the first taper of mode converter 914, where the optical signal may be coupled up into the absorption region of QD layer 920. The quantum dots in the absorption region may absorb photons from the optical signal. The absorption of photons may cause electron-hole pairs to form in QD layer 920. The electrons and holes may respectively migrate toward a cathode and an anode (both not shown), thereby generating the photocurrent.

One side effect of photodetectors is the generation of a small current due to defects in the absorption region. This current is referred to as dark current. Because the total current through a photodetector is the sum of the photocurrent and dark current, dark current reduces the overall sensitivity of the photodetector and is therefore undesirable. QD photodetector 900 reduces the generation of dark current by using a QD material in the absorption region. When QD layer 920 is etched to form the mesa structure, the side walls of QD layer 920 are exposed. If a QW or bulk semiconductor material were used as the absorption region, the entirety of the exposed sidewalls would be susceptible to defects, which can cause the generation of dark current. However, since QD layer 920 is formed using a QD material, not all the atoms that make up the sidewalls of QD layer 920 are photon-absorbing quantum dots. As a result, QD layer 920 is less susceptible to defects compared to QW or bulk semiconductor photodetectors. Accordingly, QD photodetector 900 generates less dark current, and, as a result, has greater sensitivity compared to QW or bulk semiconductor photodetectors.

Figure 9C:
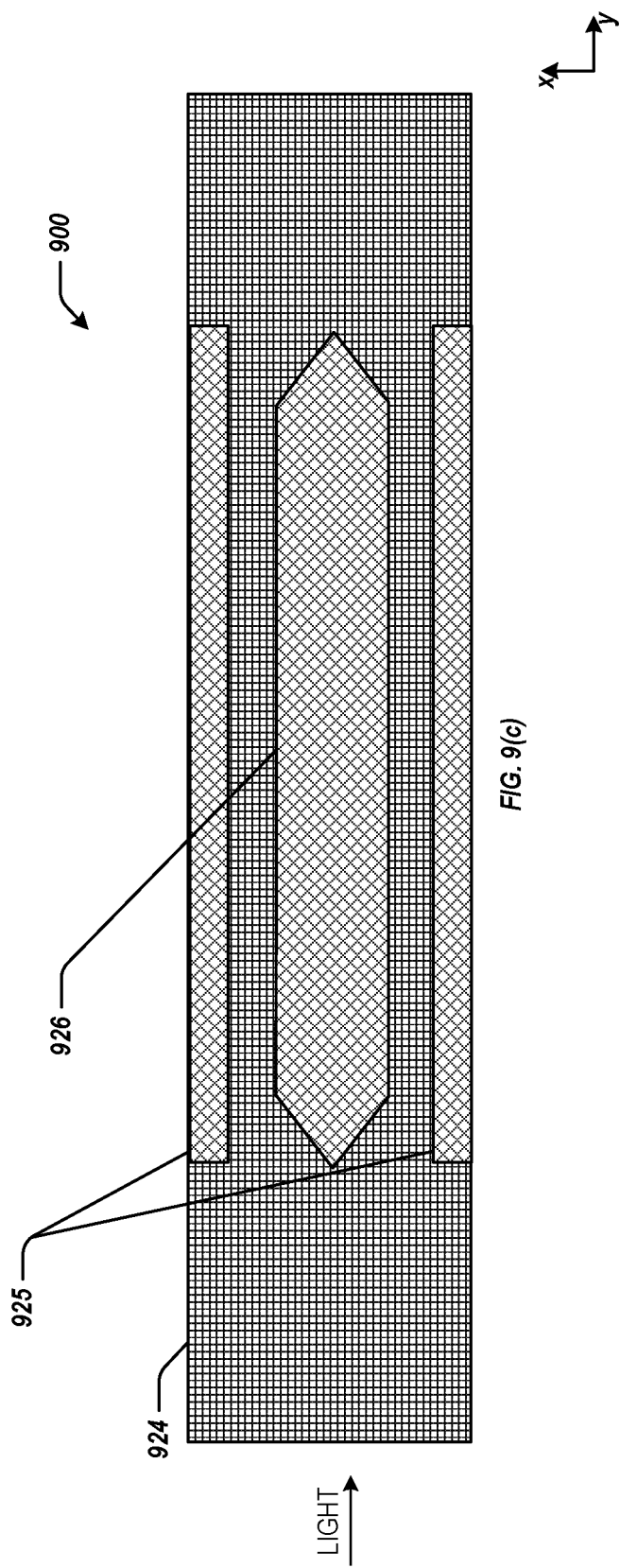

FIG. 9(c) is a block diagram depicting a top-down view of QD photodetector 900. As shown in FIG. 9(c), additional layers are illustrated, such as a pair of metal layers 925 above lower cladding layer 924 and a metal layer 926 above QD layer 920. The number and arrangement of these components is an example only and provided for purposes of illustration. Other arrangements and numbers of components may be utilized without departing from the examples of the present disclosure.

Metal layers 925 and 926 may be electrodes, and may function as the anode and cathode for generating a photocurrent from photons absorbed in the absorption region of QD layer 920. In some implementations, metal layers 925 and 926 may be formed from various types of electrically conducting metals.

FIGS. 10(a)-10(c) are block diagrams depicting top-down views of an example variations on QD photodetector 900 illustrated in FIGS. 9(a)-9(c). The number and arrangement of these components is an example only and provided for purposes of illustration. Other arrangements and numbers of components may be utilized without departing from the examples of the present disclosure.

As show in FIG. 10(a), a QD photodetector 1010 may include a waveguide 1011 to receive an optical signal and a ring demultiplexer 1012 to demultiplex a specific wavelength of the received optical signal before being coupled to a waveguide 1013 and a QD layer 1014 above waveguide 1013. In other words, ring demultiplexer 1012 selects a specific wavelength of the optical signal to be coupled from waveguide 1011 to waveguide 1013. As the optical signal is coupled from waveguide 1013 up into QD layer 1014, an absorption region in QD layer 1014 may absorb photons from the optical signal to generate a photocurrent.

As show in FIG. 10(b), a QD photodetector 1020 may include a waveguide 1021 to receive an optical signal and a ring demultiplexer 1022 comprising a waveguide 1023 to demultiplex the received optical signal before being coupled to a QD layer 1024 above a portion of waveguide 1023 of ring demultiplexer 1022. The optical signal may be coupled from waveguide 1021 to waveguide 1023 of ring demultiplexer 1022. The optical signal may travel multiple times around the ring, thereby having multiple opportunities to be absorbed in the absorption region of QD layer 1024, which improves the absorption and efficiency of QD photodetector 1020.

As show in FIG. 10(c), a QD photodetector 1030 may include a waveguide 1031 to receive an optical signal and a ring demultiplexer 1032 comprising a waveguide 1033 to demultiplex the received optical signal before being coupled to a QD layer 1033 above the entire waveguide (not shown) of ring demultiplexer 1032. Similar to QD photodetector 1020 of FIG. 10(b), the optical signal may be coupled from waveguide 1031 to the waveguide of ring demultiplexer 1032. The optical signal may travel multiple times around the ring, thereby having multiple opportunities to be absorbed in the absorption region of QD layer 1033, which improves the absorption and efficiency of QD photodetector 1030.

The foregoing disclosure describes a number of example implementations of QD optical systems. For purposes of explanation, certain examples are described with reference to the components illustrated in FIGS. 1(a)-1(d), 2, 4(a) and 4(b), 5(a) and 5(b), 6(a) and 6(b), 7, 8(a) and 8(b), 9(a)-9(c), and 10(a)-10(c). The functionality of the illustrated components may overlap, however, and may be present in a fewer or greater number of elements and components. Further, all or part of the functionality of illustrated elements may co-exist or be distributed among several geographically dispersed locations. Moreover, the disclosed examples may be implemented in various environments and are not limited to the illustrated examples. Thus, the present disclosure merely sets forth possible examples of implementations, and many variations and modifications may be made to the described examples. All such modifications and variations are intended to be included within the scope of this disclosure and protected by the following claims.

The invention claimed is:

1. A quantum-dot (QD) semiconductor optical amplifier (SOA), comprising:
   a silicon substrate;
   a QD layer above the silicon substrate, the QD layer including an active gain region to amplify a lasing mode received from an optical signal generator, the QD layer having a gain recovery time such that the active gain region amplifies the received lasing mode without pattern effects;
   a waveguide included in an upper silicon layer of the silicon substrate; and
   a mode converter included in the waveguide to facilitate optical coupling of the received lasing mode between the QD layer and the waveguide, the mode converter comprising a plurality of tapers in the waveguide, the tapers coinciding with the QD layer in a direction perpendicular to the silicon substrate.

2. The QD SOA of claim 1, wherein the QD layer includes a plurality of tapered junctions, each of the plurality of tapered junctions being at opposite ends of the QD layer along a length of the QD SOA.

3. The QD SOA of claim 2, wherein a width of the QD layer between the tapered junctions is greater than a width of the waveguide.

4. The QD SOA of claim 1, wherein:
   the QD layer is on top of a portion of the waveguide; and
   wherein the tapers are under the QD layer.

5. The QD SOA of claim 1, wherein the waveguide includes a first width and a second width, the first width being greater than the second width, and the mode converter tapers transition the waveguide between the first width and the second width.

6. The QD SOA of claim 1, wherein the waveguide includes a first width, a second width, and a third width, the first width being greater than the second width and the third width, the third width being greater than the second width, and the mode converter tapers transition the waveguide between the first width and the second width, the second width and the third width, and the third width and the first width.

7. The QD SOA of claim 6, wherein the QD layer comprises a first QD SOA region and a second QD SOA region, the first QD SOA region being above the waveguide at the second width and the second QD SOA region being above the waveguide at the third width.

8. A quantum-dot (QD) semiconductor optical amplifier (SOA), comprising:
   a silicon substrate;
   a QD layer above the silicon substrate, the QD layer including a first QD SOA region and a second QD SOA region, the first QD SOA region to amplify a lasing mode received from an optical signal generator and the second QD SOA region to reduce noise amplitude of the lasing mode, the QD layer having a gain recovery time such that the first QD SOA region amplifies the lasing mode without pattern effects;
   a waveguide included in an upper silicon layer of the silicon substrate;
   a mode converter included in the waveguide to facilitate optical coupling of the lasing mode between the QD layer and the waveguide;
   first and second electrodes above the QD layer, the first electrode to inject electrical carriers into the first QD SOA region and the second electrode to inject electrical carriers into the second QD SOA region; and
   an isolating region electrically isolating the first and second electrodes.

9. The QD SOA of claim 8, wherein the second QD SOA region is to remove noise from the lasing mode when driven into saturation.

10. The QD SOA of claim 8, wherein the mode converter comprises a first taper, a second taper, and a third taper, the first taper transitioning the waveguide from a first width to a second width, the second taper transitioning the waveguide from the second width to a third width, and the third taper transitioning the waveguide from the third width to the first width.

11. The QD SOA of claim 10, wherein the isolating region is on top of the second taper.

12. The QD SOA of claim 11, wherein:
   the first QD SOA region is on top of the waveguide at the second width; and
   the second QD SOA region is on top of the waveguide at the third width.

13. The QD SOA of claim 8, wherein the second QD SOA region has a higher saturation output power than the first QD SOA region.

14. The QD SOA of claim 8, wherein a length of the first QD SOA region is greater than a length of the second QD SOA region.

15. The QD SOA of claim 8, wherein:
   the QD layer includes a saturable absorber (SA) region between the first QD SOA region and the second QD SOA region:
   the QD SOA comprises a third electrode above the QD layer to inject electrical carriers into the SA region; and
   the QD SOA comprises a second isolating region, the first isolating region electrically isolating the first and third electrodes, and the second isolating region electrically isolating the third and second electrodes.

16. The QD SOA of claim 15, wherein:
   the second QD SOA region is to remove '1'-level noise from the lasing mode; and
   the SA region is to remove '0'-level noise from the lasing mode.

17. The QD SOA of claim 15, wherein:
   the first QD SOA region and the second QD SOA region are forward biased; and
   the SA region is reverse biased.

18. A quantum dot (QD) photodetector, comprising:
   a silicon substrate;
   a waveguide included in an upper silicon layer of the silicon substrate;
   a mode converter included in the waveguide to facilitate optical coupling of an optical signal between the waveguide and a QD layer; and
   the QD layer above the waveguide, the QD layer including an absorption region to absorb photons from the coupled optical signal and generate a photocurrent from the absorbed photons,
   wherein the mode converter comprises a plurality of tapers in the waveguide, the tapers coinciding with the QD layer in a direction perpendicular to the silicon substrate.

19. The QD photodetector of claim 18, comprising:
   a ring demultiplexer to demultiplex a specific wavelength of the optical signal before being coupled to the QD layer.

20. The QD photodetector of claim 19, wherein the QD layer is above a portion of the ring demultiplexer.

\* \* \* \* \*